United States Patent [19]

Paquette et al.

[11] Patent Number: 4,979,019
[45] Date of Patent: Dec. 18, 1990

[54] PRINTED CIRCUIT BOARD WITH INORGANIC INSULATING MATRIX

[75] Inventors: Edward L. Paquette, Claremont; William C. Riley, Palos Verdes Estates; Paul A. Taparauskas, Solana Beach; James W. Warren, Woodland Hills, all of Calif.

[73] Assignee: Refractory Composites, Inc., Whittier, Calif.

[21] Appl. No.: 193,519

[22] Filed: May 11, 1988

[51] Int. Cl.$^5$ .............................. H01L 39/02
[52] U.S. Cl. ......................... 357/80; 357/74; 357/71; 174/35 R; 174/258; 338/307; 338/308; 361/386; 361/387; 361/388; 361/424
[58] Field of Search ............ 357/80, 74, 65, 75, 357/71, 74 R, 74 F, 74 B, 74 A; 174/68.5, 252, 256, 258, 255, 35 MS, 35 R; 361/400, 411, 386, 387, 388, 424; 338/307, 308

[56] References Cited

U.S. PATENT DOCUMENTS

| | | |
|---|---|---|
| 3,969,754 | 7/1976 | Kuniya et al. .................. 357/65 |
| 4,513,055 | 4/1985 | Leibowitz ................... 174/68.5 X |
| 4,650,922 | 3/1987 | McPherson ................. 357/74 X |
| 4,707,394 | 11/1987 | Chant ....................... 174/68.5 X |
| 4,781,969 | 11/1988 | Kobayashi et al. ......... 174/68.5 X |
| 4,800,481 | 1/1989 | Dixon et al. ............... 174/68.5 X |
| 4,801,489 | 1/1989 | Nakagawa et al. ....... 174/35 MS X |
| 4,804,575 | 2/1989 | Kohm ........................ 174/68.5 X |
| 4,814,945 | 3/1989 | Leibowitz ................. 174/68.5 X |

FOREIGN PATENT DOCUMENTS 0557924  2/1980  Japan ................................ 338/307

OTHER PUBLICATIONS

Rahemba, "Method for Printed Circuit Plating", IBM Technical Disclosure Bulletin, vol. 10, No. 7, Dec. 1967, p. 870.

Primary Examiner—William Mintel
Attorney, Agent, or Firm—Ellsworth R. Roston; Charles H. Schwartz

[57] ABSTRACT

A printed circuit board has a base made from fibers (e.g., ceramic) and an inorganic coating (e.g., silicon carbide) covering the fibers to provide the base with inorganic properties. The base may have a particular coefficient of thermal expansion (CTE) as by providing the fibers with particular characteristics in the plane of, and perpendicular to, the base. The base may be isotropic thermally as by disposing the fibers in two adjacent transverse layers. An inorganic material (e.g. copper) on the base provides a radio frequency barrier. An inorganic material (e.g., silicon dioxide) on the RF barrier constitutes a dielectric insulator. An electrically conductive layer (eg. copper) partially covers the dielectric layer in a pattern defining an electrical circuit. A dielectric material (eg., silicon dioxide) fills the remaining space in this layer in a flush relationship with the conductive layer. Electrically conductive posts are added to coincide with the pads of an integrated circuit chip mounted on the board and having the particular CTE and an electrical continuity with the electrical circuit. A dielectric material fills the remaining space in flush relationship with the conductive layer. Alternatively, an electrically conductive layer defining a second printed circuit may be disposed on the first circuit and may communicate electrically with the first circuit via posts. A dielectric material may be disposed in the spaces between such circuits. The chip may then be disposed on the second circuit and may be electrically connected to the first and second circuits.

30 Claims, 12 Drawing Sheets

FIG. 2
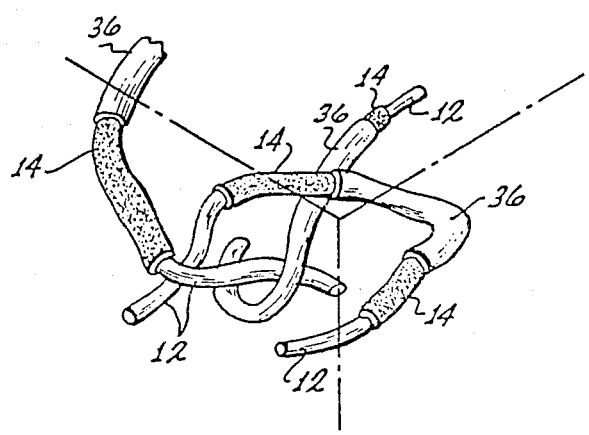
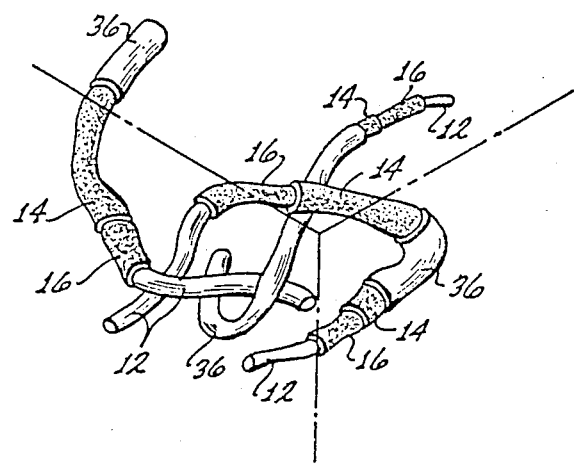
FIG. 3
FIG. 4
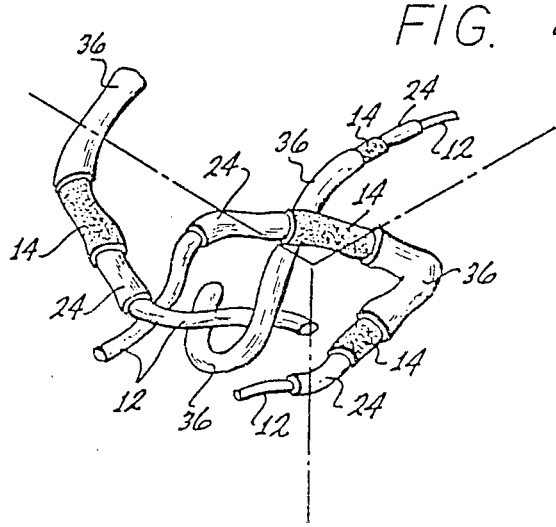

COATING STUDY ON

WEAR-TEST SPECIMENS

Allowed for .005 coating on OD, ID, & Thickness.

Run Condition Matrix

| RUN # | TEMP (°C) | PRESS ("Hg) | Dimethyl-chloro-silane (DMS) cc/Hr | Argon (cc/Min) | Hydrogen ($H_2$) | Vickers Hardness Number ($HV_n$) |
|---|---|---|---|---|---|---|
| 1 | 1060°C | 29" | 600 | 9000 | --- | 4120 |
| 2 | 1040°C | 23" | 600 | 9000 | --- | 3240 |
| 3 | 1050°C | 23" | 600 | 7000 | --- | 3800 |
| 4 | 1100°C | 23" | 600 | 9000 | --- | 2860 |
| 5 | 1040°C | Cyclical mts | 600 | ---- | 9000 | 1800 |

STANDARD INFILTRATION CYCLE CONDITIONS

Run 2 sets/run (2 rotating washers and 2 stationary discs)

Set-up Geometry same for Run's #1-4

FIG. 8

CVD SiC 5000X BLOCKY GRAIN

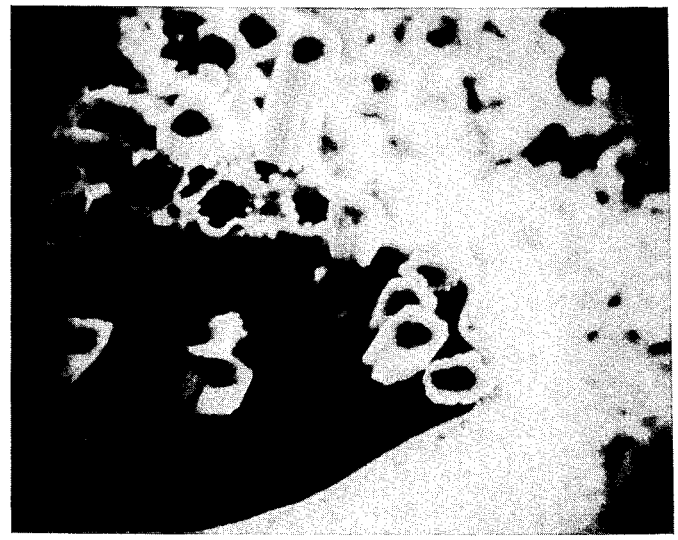
FIG. 10a
FIG. 10b
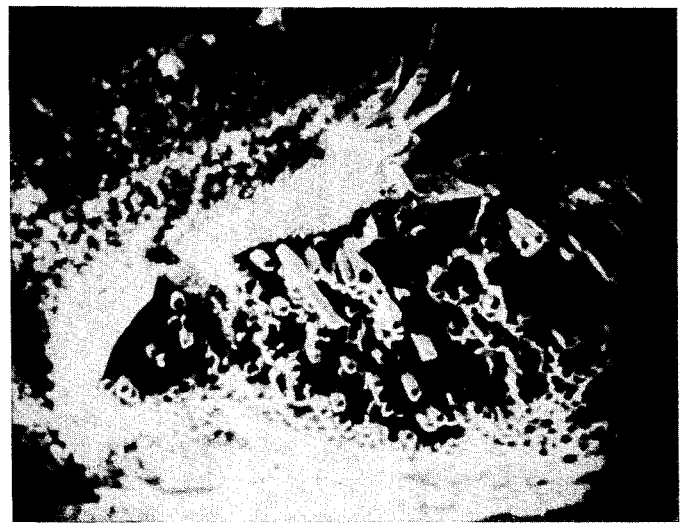

RE-COMP-201 CVD SiC INFILTRATED
CARBON/CARBON COMPOSITE 2400X

RE-COMP-201 CVD SiC INFILTRATED
CARBON/CARBON COMPOSITE 600X

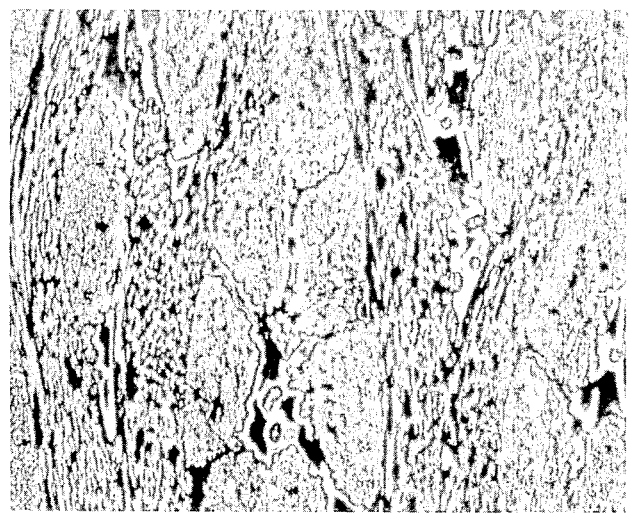
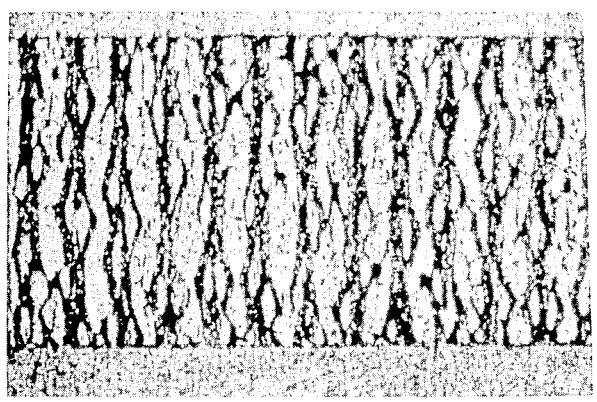
FIG. 15

RE-COMP-201 CVD SiC INFILTRATED
CARBON/CARBON COMPOSITE 500X

PRINTED CIRCUIT BOARD WITH INORGANIC INSULATING MATRIX

This invention relates to printed circuit boards and to methods of making such printed circuit boards. More particularly, the invention relates to a combination of printed circuit boards and integrated circuit chips disposed on the boards and having substantially the same coefficient of thermal expansion as the printed circuit boards and further relates to methods of producing such combinations of such boards and such chips. The invention particularly relates to printed circuit boards made from inorganic materials to provide the printed circuit boards with increased properties of thermal conductivity and with increased ranges of temperature operation and to provide the boards with enhanced flexibilities in the electrical properties capable of being provided in the boards.

BACKGROUND OF THE INVENTION

The printed circuit boards now in use are made from organic materials. These materials limit the properties of the board. For example, when integrated circuit chips are disposed on the boards, and are connected electrically to the boards, the chips have a significantly lower coefficient of thermal expansion than the boards. This limits the temperature range to which the integrated circuit chips and the boards can be subjected. At temperatures above such ranges, the board tends to expand significantly relative to the chips that the electrical connections between the chips and the boards tend to become interrupted. This has been particularly true in recent years because the size of the integrated circuit chips has been progressively reduced without significantly reducing the heat generated in the chip. As a result, the temperatures produced in many chips have progressively increased and have produced hot spots in the printed circuit board at the positions where the chips tend to be electrically connected to the printed circuit boards. This has aggravated the tendency for the chips to become disconnected electrically from the printed circuit boards.

The temperatures generated in the chips also present another problem. Since the printed circuit boards are made from an organic material, their properties deteriorate at elevated temperatures. The temperatures generated in the chips produce hot spots on the board. These hot spots cause the properties of the boards at such hot spots to degenerate. These hot spots sometimes causes the printed circuit boards to melt at such hot spots. The heat cannot be dissipated by the printed circuit board and therefore adversely effects the life of the chip.

The printed circuit boards now in use also have other significant disadvantages. For example, since the boards are made from organic materials, they can be exposed to manufacturing processes only in limited temperature ranges without damaging their properties. This has prevented layers on the printed circuit boards from being doped to produce alloys with modified electrical resistances. The reason is that the doping of such layers has to occur at high relatively temperatures or imposes ion bombardment that damages organic resins. As a result, electrical resistances have had to be adjusted by pattern geometry techiques. This has considerably increased the planar space which has had to be occupied by the circuitry including the modified total resistance geometry structures.

There is another significant disadvantage in the printed circuit boards now in use, particularly when the boards have multiple layers of electrical circuitry. In these boards, electrical connections between adjacent layers are provided by producing holes in the dielectric layers between the electrically conductive layers and by plating with an electrically conductive material the surfaces defining the holes. This has produced an increase in the number of steps required to produce the printed circuit board, thereby increasing the cost of producing the boards and decreasing the rate at which the boards can be produced. Plating deposition defects and the high mismatches experienced in the coefficient of thermal expansion with multilayer printed circuit boards have led to reduced production yields and increased in service failure rates.

SUMMARY OF THE INVENTION

This invention provides a printed circuit board which overcomes the above disadvantages. The printed circuit boards of this invention have substantially the same coefficient of thermal expansion as the integrated circuit chips disposed on the boards which are electrically connected to the printed circuits on the boards. Furthermore, the boards are able to withstand high temperatures generated in the chips without affecting the characteristics of the boards even at the board positions contiguous to the chips. Since the boards are completely, or at least essentially, inorganic, doped layers can be produced on the board to produce electrical resistances of any desired values. Vias can also be provided between conductive layers defining printed circuits to facilitate electrical connections a strategic terminals between the layers.

In one embodiment of the invention, an integrated circuit chip is disposed on, and electrically connected to, a printed circuit board. The board and the chip have substantially the same coefficient of thermal expansion. The board has a base made from fibers (e.g., carbon, ceramic) and an inorganic coating (e.g., silicon carbide, silicon nitride) covering the fibers to provide the base with inorganic properties. The base may be provided with substantially the particular coefficient of thermal expansion as by providing the fibers with particular characteristics in the plane of, and a direction perpendicular to, the base. The base may be isotropic thermally as by disposing the fibers in two adjacent transverse layers.

An inorganic material (e.g. tungsten, copper) on the base provides a radio frequency (RF) barrier. An inorganic material (e.g., silicon dioxide, aluminum nitride) on the RF barrier constitutes an insulating dielectric. An electrically conductive layer (e.g. copper) partially covers the dielectric layer in a pattern defining an electrical circuit. Alternatively, the electrically conductive layer may be partially conductive to define electrical resistances. An insulating dielectric material (e.g. silicon dioxide) fills the remaining space in this layer in a flush relationship with the conductive layer. Electrically conductive posts are then added to coincide with the pads of the surface mount chip. A final dielectric or electrical insulating material fills the remaining space so to be flush with the conductive layer.

The chip may be disposed on the printed circuit layer in electrical continuity with such circuit. Alternatively, an electrically conductive layer defining a second printed circuit may be disposed on, and in electrical communication with, the first circuit through conductive posts. A dielectric material may be disposed in the spaces between such circuit. Electrically conductive posts are then added to coincide with the pads of the surface mount chip. A final dielectric or electrical insulating material fills the remaining space so to be flush with the conductive layer. The chip may then be disposed on the second circuit and may be electrically connected to the first and second circuits.

BRIEF DESCRIPTION OF THE DRAWINGS

In the drawings:

FIG. 2 through 7 are schematic illustrations of different embodiments of materials capable of being used as the support base within the printed circuit board of this invention;

FIG. 8 is a table showing the wear-test characteristics of different specimens of materials capable of being used as the support base of the printed circuit boards of this invention;

FIG. 9 through 16 are copies of photographs, generally quite magnified, of the construction and characteristics of different specimens of materials capable of being used as the support base in the printed circuit boards of this invention;

DESCRIPTION OF THE PREFERRED EMBODIMENTS

Figure 17:
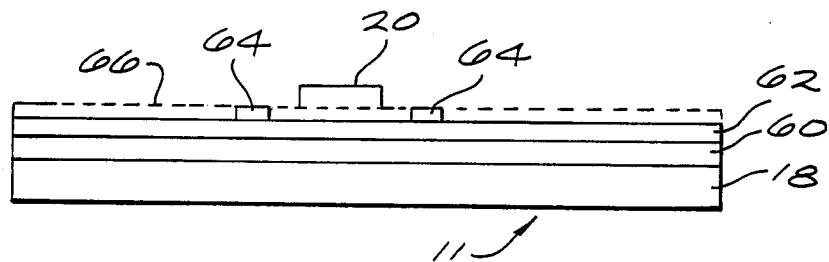
FIG. 17 is a sectional view of a printed circuit board of this invention.

In one embodiment of the invention, a substrate generally indicated at 10 may be provided with porous and permeable properties. The substrate 10 is included in a printed circuit board generally indicated at 11 (FIG. 17). The substrate may be formed from discrete elements 12 (FIG. 2) such as fibers or grains or a mixture of fibers and grains. The discrete elements may have a carbon or ceramic base. By way of illustration, the discrete elements may be formed from a suitable material such as pyrolyzed wool, rayon, polyacrylonitrile or pitch fibers. Carbonized rayon felt, chopped fibers of carbonized polyacrylonitrile, carbonized rayon cloth made from interwoven carbon fibers, a tape material made of closely woven, carbonized PAN fibers, a macerated material comprising a multiplicity of randomly oriented pyrolyzed wool fibers and a macerated material having a multiplicity of chopped pitch fibers have specifically been used as substrates.

The substrate can also advantageously be formed from a slurry comprising granular material such as silicon carbide or graphite Such granular material can also be mixed with short lengths of high-temperature-resistant fibers selected from the group consisting of ceramic, pyrolyzed wool, rayon, polyacrylonitrile and pitch.

The slurry may also include a suitable carbonaceous binder such as petroleum pitch, coal tar pitch, furan resins and phenolic resins. The slurry used to form the substrate may also comprise short lengths of polyacrylonitrile fibers intermixed with silicon carbide in granular form.

The different substrates described above may be formed on a continuous basis or may be formed by cyclic or pulsing techniques. When cyclic or pulsing techniques are used, a sequence of steps is provided under controlled conditions for limited periods of time. The controlled conditions are then relieved and the sequence under the controlled conditions is repeated more than once. An example is specified subsequently in Example 11.

The substrate described in the previous paragraph may be directly coated with a matrix 14 as shown in FIG. 2 to form a support base 18 (FIG. 17) for the printed circuit board 11. However, in order to coat the matrix 14 directly on the substrate 10, the substrate 10 is initially shaped preferably to a planar configuration corresponding to the planar configuration of the support base 18 for the printed circuit board 11. The substrate 10 is then preferably retained in the desired configuration while the matrix 14 is being deposited on the substrate. This retention may be provided by a tool or fixture (not shown) which is constructed to retain the substrate 10 in the desired configuration while still providing for the coating of the matrix at every desired position on the substrate.

Coating of the matrix on the substrate in the manner described in the previous paragraph is advantageous in that it is direct and does not require any intermediate preparation of the substrate. However, it generally requires the preparation of special tools and fixtures. Furthermore, it increases the space requirements for the coating operation because of the use of the tools or fixtures. It also tends to slow the rate at which the matrix 14 is coated on the substrate 10.

Alternatively, pyrolyzed carbon 16 may be deposited on the substrate 10, as shown in FIG. 3, before the deposition of the matrix on the substrate. The pyrolyzed carbon 16 facilitates the promotion of a good load transfer between fibers, particularly when the printed circuit board 11 is stressed. The pyrolyzed carbon 16 also helps to strengthen and stabilize the substrate 10, particularly when the article is subjected to stress. It also enhances the mechanical interface for increasing the surface fracture energy of the composite structure defining the support base 18 for the printed circuit board 11, thus enhancing the toughness and flow resistance of the printed circuit board 11.

To provide the coating 16 of pyrolyzed carbon on the substrate 10, the substrate may be disposed in a furnace of conventional design. The temperature of the substrate may then be raised to a suitable temperature such as approximately 1800° F. and a vacuum in the order of 15 mm mercury (hg) may be maintained within the deposition chamber. Pyrolyzed carbon may then be deposited about each of the discrete elements 12 in the substrate 10 by flowing methane gas through the porous substrate for an extended period of time such as about fifty (50) hours.

When the pyrolyzed carbon is deposited on the substrate 10 in the manner discussed in the previous paragraph, it encases the discrete elements defining the substrate. This is illustrated schematically at 16 in FIG. 3. The layer of pyrolyzed carbon 16 is porous and permeable to oxygen. With a density of the substrate in the order of 0.1 gm/cc and a fiber volume of about fifteen percent (15%) before the deposition of the pyrolyzed carbon 16, the substrate encased with the pyrolyzed carbon may have a density in the order of 0.75 gm/cc. The pyrolyzed carbon 16 serves to position the discrete elements 12 in the substrate 10 and to strengthen the substrate for handling purposes. In this way, the matrix 14 can be deposited on the substrate 10 without requiring any tools or fixtures to be used.

The pyrolyzed carbon 16 can be deposited on the substrate by other techiniques than those discussed above. For example, the substrate 10 can be coated with any suitable and conventional type of resin such as a phenolic designated by Monsanto Chemical Company as Monsanto 1008. As a first step, the phenolic may be dissolved in a solvent such that it is fluid. The solvent may illustratively be methyllethyllketone. The substrate 10 may then be coated with the phenolic and partially polymerized so that it is dry to the touch. Patterns of the desired planar shape can then be cut from the substrate 10 or the substrate can be heated to a temperature of at least 160° F., compressed and then cut to the desired shape. The patterns in the desired shape may then be placed in a mold and heated to a suitable temperature such as approximately 350° F. to cure the phenolic. The patterns may then be cured at a temperature above 350° F. to stabilize the system.

Figure 6:
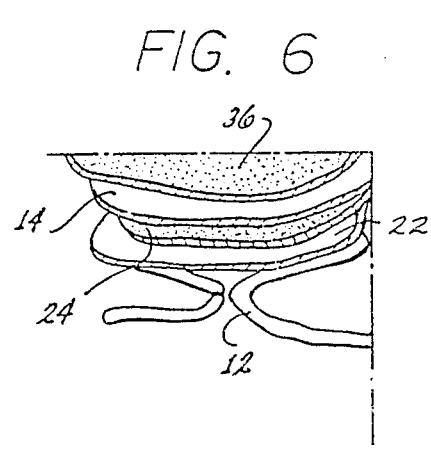

The phenolic is then pyrolyzed at a temperature of approximately 1600° F. to decompose it to carbon, its elemental form. One reason for the pyrolysis is to prevent the substrate from thereafter emitting gases when it is heated. However, the discrete elements 12 are retained in position by the pyrolyzed carbon 16 which is disposed in the interstices between the discrete elements, as shown in FIG. 6. The deposition of the pyrolyzed carbon 16 in the interstices between the discrete elements 12 is illustrated schematically at 22 in FIG. 2. The combination of the discrete elements 12 and the pyrolyzed carbon 16 in the interstices 22 may be porous and permeable to oxygen.

When the binder constituting the phenolic is pyrolyzed as discussed in the previous paragraph, it loses approximately half of its mass and it shrinks and cracks. In spite of this, the pyrolyzed carbon is able to hold the discrete elements 12 in position in the substrate and to impart strength to the substrate. The substrate 10 is then heated to a temperature of approximately 2200° F. for a relatively short period of time to impart a final shrink and pyrolyzation to the binder.

Polyurethane or polyethylene can be included in the phenolic binder before the binder is cured and pyrolyzed as discussed in the previous paragraphs. When the substrate 10 and the binder are then heated to approximately 1600° F., the polyurethane or polyethylene vaporizes to facilitate the formation of tunnels in the substrate. As will be disclosed in detail subsequently, the tunnels are effective in providing paths for depositing the matrix 14 on the substrate 10 as by chemical vapor deposition.

Instead of using a wet binder to coat the discrete elements 12, a dry binder may be used. Dow Corning Polycarbosilane 6-2330 is illustrative. This is a dry resin which may mixed with methyl ethyl ketone to provide a fluid mixture with which to work. This material has properties of becoming partially polymerized at room temperatures. The material is mixed with the substrate and is then heated to a temperature of approximately 1600° F. to pyrolyze the binder. The material is subsequently heated to a temperature of approximately 2200° F. to provide it with a final pyrolyzation and shrink.

Figure 7:
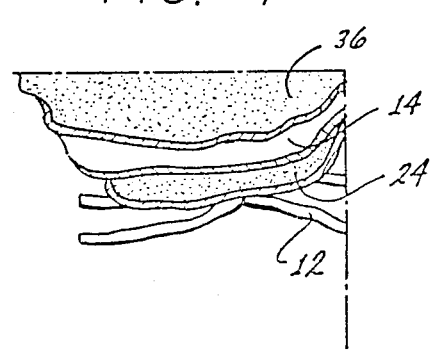

Sodium silicate or colloidal alumina can also be used as binders. The substrate 10 may be dipped into sodium silicate in liquid form and may then be heated. The sodium silicate flows along the lengths of the discrete elements 12 and tends to congregate or agglomerate at the interstices between the discrete elements. The formation of layers of material at the interstices between the fibers of the substrate 10 is shown in FIGS. 6 and 7.

As will be appreciated, the characteristics of the substrate can be considerably varied without departing from the scope of the invention. For example, when fibers are used in a woven form, the relative numbers of threads in warp and woof can be varied in great proportions and the spacings between the threads can also be varied considerably. As will be appreciated, such variations in the characteristics of the substrate 10 produce variations in the coefficient of thermal expansion of the substrate, thereby producing variations in the coefficient of thermal expansion of the support base 18.

The discrete elecments 12 for the substrate 10 are preferably chosen to control the coefficient of thermal expansion of the support base 18. In this way, the coefficient of thermal expansion of the support base 18 will substantially match the coefficient of thermal expansion of an integrated circuit chip 20 disposed on the board 11 in bonded relationship to the board. For example, the composition and thickness of fibers constituting the substrate 10 may be chosen to provide a matching of the coefficient of the thermal expansion of the support 18 (FIG. 17) with that of the integrated circuit chip 20. It will be appreciated that the composition and thickness of the pyrolized fibers 16 and of the matrix 14 may also be tailored to provide a match between the coefficient of thermal expansion of the support base 18 with that of the integrated circuit chip 20. The integrated circuit chip 20 may be made from a suitable material such as silicon or gallium arsenide.

The support base 18 may also be constructed to be isotropic. In this way, the coefficient of thermal expansion of the support base 18 may be the same in substantially all directions in the plane of the support base. The support base 18 may be provided with isotropic properties as by providing two (2) substantially identical layers as 22 and 24 in FIG. 6 and by disposing one (1) of the layers in a relationship displaced by approximately 90° from the other layer in the plane of the support base 18. In effect, the warp of the layer 22 may constitute the woof of the layer 24 and vice versa. In this way, heat generated by the integrated circuit chip 20 can be dissipated by the support base 18 substantially equally in all directions substantially parallel to the plane of the support base 18.

Figure 5:
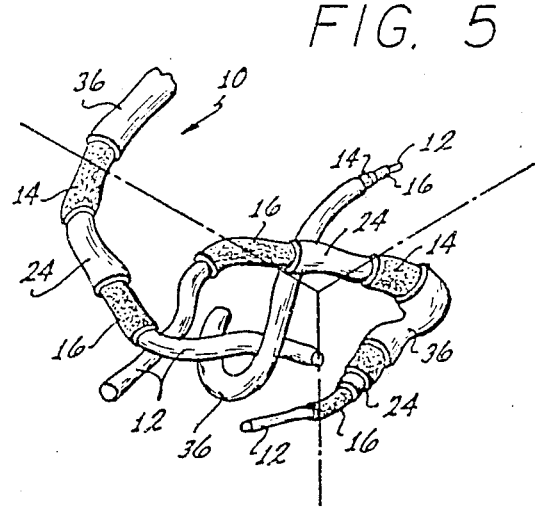

A suitable material such as silicon carbide can be applied to the substrate 10 to form an intermediate layer 26 between the substrate 10 and the matrix 14. This intermediate layer 26 may be deposited on the substrate 10 before the deposition of the matrix 14, as shown in FIG. 4. The intermediate layer 26 may also be deposited on the pyrolyzed layer 16 as shown in FIG. 5. This intermediate layer 26 may have a density in the order of 1 gram/cubic centimeter. To produce this intermediate layer 26, the temperature of the substrate may be raised to about 1600° F.–2200° F. and a vacuum in the order of about 0.1 to 0.6 atmosphere may be maintained within the furnace. A methylchlorosilane gas may then be flowed interstitially through the substrate 10 for a period of about one (1) to (20) hours. By this method, a substantially uniform layer 26 of silicon carbide may be deposited about each of the fibers within the substrate to form the intermediate substrate with the density in the order of about 0.4 to 2.35 gram/cubic centimeter. Other suitable materials for the layer 26 may be metal oxides, metal nitrides, metal silicides, metal borides and metal carbides. The intermediate layer 26 may be viscous.

As previously described, the substrate 10 is porous and permeable to oxygen. This means that air can penetrate into the substrate 10 and oxidize the carbon in the substrate. This can produce a deterioration in the properties of the substrate 10 over a period of time. The matrix 14 may not be helpful in inhibiting the oxidation of the substrate since the matrix is generally porous and permeable to oxygen. The intermediate layer 26 is accordingly helpful in inhibiting the oxidation of the substrate 10.

The impermeable coating 26 may be deposited on the substrate 10 before the matrix 14 is deposited on the substrate. When the pyrolyzed carbon 16 encases the discrete elements 12, the impermeable coating 26 encases the pyrolyzed carbon as schematically shown in FIG. 2. The impermeable coating 26 is disposed in the interstices between the discrete elements 12, as shown schematically in FIGS. 6 and 7, when the pyrolyzed carbon is disposed in the interstices.

The coating 26 may be relatively thin since its primary function is to serve as a barrier for preventing air from reaching the substrate 10 to oxidize the substrate. However, it also renders the substrate 10 impermeable to corrosion and erosion caused by high temperatures and exposure to hostile fluids. The impermeable coating 26 may be made from a suitable material such as silicon nitride.

When the coating 26 of a material such as silicon nitride is deposited on the substrate 10, it may not have any chemical bond with the substrate. Furthermore, any mechanical bond between the coating 26 of silicon nitride and the substrate 10 may be relatively weak. Since a strong bond is absent between the substrate 10 and the coating 26, increased surface fracture energy (toughness) is produced between the substrate and the coating. Flow sensitivity in the support base 18 is also reduced. Preferably, the coating 26 does not have any chemical bond, and a low mechanical bond, with the substrate 10. However, the coating 26 may be formed within the scope of this invention to have a chemical bond, and an increased mechanical bond, with the substrate 10. This is particularly true if the support base 18 is provided with the same coefficient of thermal expansion as the integrated circuit chip 20. It is also particularly true if the support base 18 is constructed to be isotropic.

The coating 26 of a material such as silicon nitride may also have a significantly different coefficient of thermal expansion than the substrate 10. As a result, the layer 26 of silicon nitride may be free to move relative to the substrate 10 with changes in temperature. This may be particularly important because of the considerable range of temperatures (in the hundreds of degrees Fahrenheit) to which the integrated circuit chip 20 may be subjected when it operates.

Since the integrated circuit chips 20 are small, the elevated temperatures in the hundreds of degrees Fahrenheit (and even sometimes well in excess of one thousand degrees Fahrenheit) are local. For example, the integrated circuit chips 20 may sometimes be as small as one quarter inch in each of two (2) co-ordinate directions along the plane of the support base 18. As a result, the localized hot spots may have an area on the printed circuit board 11 of about one quarter of an inch ($\frac{1}{4}''$) in each of the two (2) co-ordinate directions. These localized hot spots tend to produce localized hot spots in the printed circuit board 11 even when the support base 18 is isotropic and provides a good transfer of heat along the base from the hot spot. It may accordingly be desirable to provide the impermeable layer 26 with properties of being free to move relative to the substrate 10 with changes in temperature.

The coating 26 of silicon nitride may be deposited on the substrate 10 as by techniques of molten liquid as disclosed in U.S. Pat. No. 4,397,901. For example, the substrate 10 may be heated to a temperature of about 3200° F. in a controlled environment which is maintained at slightly greater than atmospheric pressure and a slurry of elemental silicon may be deposited on the discrete elements 12 coated with the pyrolytic carbon 16. The silicon-coated discrete elements 12 may then be heated to a temperature of about 3200° F. in the controlled environment and suitable gases such as silicon chloride and nitrogen may be passed through, and about, the article to deposit a coating of silicon nitride on the discrete elements 12 so as to form the layer 26.

Alternatively, the coating 26 of silicon nitride may be directly deposited on the discrete elements 12, as shown in FIG. 4, without first having to deposit molten silicon on the substrate as by the methods of the previous paragraph. This direct deposition may be accomplished as by a chemical vapor deposition. This may be accomplished by heating the discrete elements 12 in a controlled environment to a suitable temperature such as about 1800° F. and then passing gases containing silicon and nitrogen through and about the substrate. For example, the gases may be silicon chloride and nitrogen.

As previously described, the matrix 14 may be applied directly to the substrate 10. However, when the coating 26 is included, the matrix 14 may be applied on the coating. The matrix 14 may have substantially the same coefficient of thermal expansion as the coating 26. This causes the matrix 14 to expand with the coating 26 when it is disposed on the coating. The matrix 14 encases the coating 26 when the coating encases the substrate 10. The matrix 14 is disposed in the interstices of the discrete elements 12 when the coating 26 is disposed in such interstices.

When the matrix 14 is disposed on the substrate 10 without the intermediate disposition of the coating 26, the matrix 14 encases the pyrolyzed carbon 16 when the pryolyzed carbon encases the discrete elements 12. The matrix 14 is disposed in the interstices between the discrete elements 12 when the pyrolyzed carbon 16 is disposed in such interstices. The matrix 14 preferably does not have any chemical bond with the substrate 10. Furthermore, any mechanical bond between the matrix 14 and the substrate 10 is preferably relatively weak when the matrix is disposed directly on the substrate.

The matrix 14 may be formed from a suitable material consisting of a metal and a material providing negatively charged ions. Preferably the matrix 14 may be formed from a material selected from a group consisting of silcon nitride, silicon carbide and silicon oxide. The matrix 14 may be preferably formed from silicon carbide. Silicon carbide is advantageous because it is hard and tough and provides good protection to the substrate.

To apply the matrix 14 on the substrate 10, the substrate may be disposed in a furnace and heated to a temperature in the range of about 1350° F. to 2500° F. Preferably the substrate 10 is heated to a temperature of about 1800° F. in a mild vacuum. This temperature is intermediate a preferred temperature range of about 1600° F. to 2000° F. A suitable gas containing silicon and carbon may be passed through and over the substrate 10 in the furnace. For example, suitable gases such as methyltrichlorosilane, dimethyldichlorosilane and trimethylchlorosilane may be used. The gas may be allowed to fill the furnaces to a pressure between about 0.01 and 0.6 atmospheres.

Following the introduction into the furnace of the gases containing the silicon and the carbon, the gases may be withdrawn from the furnace by producing a mild vacuum. New gases containing silicon and carbon may then be introduced into the furnace. This process may be repeated through a number of cycles until the matrix has been formed with the desired thickness. The temperature of the substrate 10 may be intermittently raised to about 2700° F. to produce a dimensional stability between the silicon carbide in the matrix 14 and the pyrolyzed carbon 16 on the substrate 10.

The following chemical reaction may be produced when the gases contain methyltrichlorosilane:

$$SiCH_3Cl_3 \text{ Heat } Si + C + 3HCl \qquad (1)$$

This chemical reaction is endothermic because it requires the addition of heat. The next reaction is exothermic:

$$Si + C + 3HCl \text{ } SiC + 3HCl \qquad (2)$$

Another chemical reaction, also exothermic, after reaction (1) may be:

$$Si + 3C + 3HCl \text{ } SiC + 2C + 3HCl \qquad (3)$$

A further chemical reation, also exothermic, after reaction (1) may be:

$$Si + C + 3HCl \text{ } SiC + 3HCl \qquad (4)$$

The particular chemical constituents produced are dependent upon certain parameters including temperature, pressure, gases used, flow rate of the gases and mass rate of the gases. The mass rate is in turn dependent upon such factors as flow rate and the particular gases used.

The periodic introduction of gases to the furnace and the subsequent exhaustion of these gases from the furnace provide certain important advantages. As will be seen, the composition of the gases introduced to the furnace changes with time because of the chemical reactions in the gases and because of the exhaustion of the gases as the gases are chemically reacted to produce the matrix 14. This causes the properties of the matrix 14 to vary with time. By exhausting these gases from the furnace after a relatively short period of time and subsequently introducing a new supply of such gases, relatively constant characteristics can be provided for the matrix 14 along the full thickness of the matrix. Alternatively, the characteristics of the matrix 14 can be precisely controlled along the full thickness of the matrix to provide the matrix with the optimal properties desired for the matrix at the progressive thicknesses of the matrix. As will be appreciated, these properties may be different at different thickness positions in the matrix.

Trimethylchlorosilane is more unstable than dimethyldichlorosilane, which is in turn more unstable than methyltrichlorosilane. Since trimethychlorosilane is the most unstable of the three (3) chlorosilane compounds, it degenerates into its components more easily than the other compounds. Since the degeneration of trimethychlorosilane occurs more easily than the degeneration of the other gases and since the gases produced from the degeneration of the trimethylchlorosilane are lighter than the trimethylchlorosilane, the gases produced from the degeneration of the trimethylchlorosilane are able to travel further in an increment of time than the gases produced from the degeneration of dimethyldichlorosilane or from the degeneration of methyltrichlorosilane. This provides for a deposit of the gas components on the peripheral edges of the support base 18 more easily when trimethylchlorosilane is used than when other compounds are used.

The characteristics of the matrix 14 can be varied by varying the characteristics of the chemical vapor deposition. For example, the composition of the gases, the temperature and pressure of the gases and the flow rate and mass rate of the gases can be varied to affect the characteristics of the matrix 14. The size of the grains in the matrix 14, the orientation of the grains in the matrix and the relative amounts of free carbon and free silicon in the deposition can be controlled in this manner. The microscopic density of the silicon carbide in the matrix 14 can also be varied in this manner.

As will be appreciated, the silicon carbide in the matrix 14 can be provided with a stoichiometric ratio or with a non-stoichromatric ratio. When the silicon carbide is stoichiometric, the relative amounts of silicon and carbon can be predicted on the basis of their relative atomic weights. When there is an excess of silicon or carbon in the matrix above the stoichiometric ratio of these elements, the matrix can be considered to be non-stoichiometric. An excess of carbon in the matrix 14 produces an increase in the hardness of the matrix but also increases the tendency of the matrix to be oxidized by oxygen from the air. An excess of silicon in the matrix 14 decreases the hardness of the matrix but increases the ability of the matrix to withstand oxygen from the air. As will be appreciated, the particular material chosen to provide that excess above the stoichiometric ratio at any thickness of the matrix 14, and the relative amount of such excess at such thickness, can be chosen to tailor the characteristics of the matrix at the different thicknesses. For example, providing the silicon carbide in the matrix 14 in a non-stoichiometric ratio can affect somewhat the coefficient of thermal expansion of the support base 18. This may be important in tailoring the coefficient of thermal expansion of the support base 18 to match that of the integrated circuit chip 20.

The grain structure of the matrix 14 can be varied by varying the parameters discussed above. For example, the size of the grain can be varied between approximately fifty angstrom (50A) and approximately five microns (5u), which is in excess of fifty thousand Angstroms (50,000A). Generally, the strength of the matrix 14 is enhanced as the grain size is decreased. Actually, the grain size can be tailored to different values at different thicknesses of the matrix.

Actually, there is probably a reduction in density from a stoichiometric relationship of a material such as silicon carbide in the matrix to a non-stoichiometric relationship of the material such as silcon carbide in the matrix. However, since the atomic weight of silicon is greater than that of carbon, there is less of a reduction in density for a particular excess of silicon in the matrix than for the same excess of carbon in the matrix.

Thus, as will be seen, the properties of the matrix 14 can be varied at progressive thicknesses of the matrix. For example, it may be initially desirable to provide an excess of silicon in the matrix 14 so as to inhibit the oxidation of the matrix, at least in the areas adjacent the substrate 10. This is important in providing the support base 18 with essentially inorganic properties. It may be subsequently desirable to provide the matrix 14 with an excess of carbon. This provides the external surface of the matrix 14 with hard and dense characteristics. This causes the support base 18 to provide a firm and solid support for the different layers disposed on the support base to define the printed circuit board 11 and for the integrated circuit chip disposed on the board.

Other gases can be included in the chemical vapor deposition in addition to those specified above. For example, gases of argon and helium can be included in the gases introduced to the furnace. Both argon and helium are neutral. They impart energy to the gases in the furnace and they control the rate at which the matrix 14 is deposited on the substrate. They also control the characteristics of the deposition.

The relative amount of hydrogen in the gases can also be varied. The relative amount of hydrogen affects the chemical and heat balance of the gases introduced to the furnace. As a result, the relative amount of hydrogen in the gases affects the characteristics of the deposition. For example, when the furnace is maintained at a relatively low temperature and a considerable amount of hydrogen is introduced into the furnace, an excess of silicon above the stoichiometric ratio tends to be deposited. Furthermore, even slight changes in temperature can affect the hardness of the deposition. By way of illustration, a change of about 10° F. in the furnace can produce a change of as many as 1000 points in Vickers hardness out of a range of approximately 1300-4400 in Vickers hardness. Thus, the mixture of a small amount of hydrogen with the gases producing the matrix 14 may have a significant effect on the hardness of the matrix which is produced. This may be important when the printed circuit board 11 is to be disposed in an environment where it may be subjected to large forces involving shock or vibration.

Boron can also be included in the gases introduced into the furnace to obtain the chemical vapor deposition. The inclusion of boron in the mixture enhances the tendency of the matrix 14 produced from the deposition of the gases to be forgiving. This enhances the toughness of the matrix 14 and the ability of the matrix to withstand strain. As will be appreciated, this may be important in providing the support base 18 with optimal properties when the support base is included in the printed circuit board 11.

The boron in the mixture forming the matrix 14 acts as a getter. It accumulates the material of the matrix 14, such as silicon carbide, from active sites and causes the silicon carbide from such active sites to be sintered together. Without the inclusion of the boron, the silicon carbide tends to be deposited at the active sites. Nominally about two percent (2%) by weight of the boron may be included in the mixture. Preferably the range of boron is about one percent (1%) to three (3%) by weight. Preferably less than five percent (5%) of boron by weight is included in the mixture.

Other gases may be used in producing a chemical vapor deposition of the matrix 14 on the substrate 10 to form the support base 18. For example, a mixture of silicon tetrachloride and methane may be used. The mixture of silicon tetrachloride and methane tends to produce a deposition of silicon carbide to form the matrix. Such a mixture may require a greater amount of energy to produce the matrix than some of the gases specified above.

As will be appreciated, the substrate 10 disposed in the furnace can be pre-heated to impart energy to the gases in the furnace for enhancing the production of a chemical reaction of the gases. The resultant deposition of the material such as silicon carbide on the substrate 10 to form the matrix 14 has first characteristics. Alternatively, the substrate does not have to be pre-heated before being introduced into the furnace. In either case, the gases receive sufficient kinetic energy to produce chemical reactions when they collide. Particles of silicon carbide are produced as a soot in free space as a result of such collisions and as a result of the chemical reactions occurring during the collisions.

The characteristics of the silicon carbide produced without pre-heating the substrate 10 are different from the characteristics of the silicon carbide produced by pre-heating the substrate. This results in part from differences in microscopic structure of the grains of silicon carbide deposited on the substrate. As will be appreciated, in addition to forming the matrix 14 by the two separate techniques discussed above, the matrix 14 can be formed by a combination of such techniques to provide the matrix with a blend of characteristics.

When the matrix 14 is formed from a suitable material such as silicon carbide in the manner described above, it tends to receive microscopic cracks in its periphery. These cracks are advantageous because they tend to impart resilience and flexibility to the matrix, paraticularly when the matrix is subjected to stresses. The cracks are disadvantageous because they increase the amount of the surface exposed to oxygen. As a result, there tends to be an increase in the rate at which the matrix 14 is oxidized.

A coating 36 impermeable to oxygen may be disposed on the matrix 14 to cover the matrix and inhibit the oxidation of the matrix. This is particularly important when the matrix 14 has microscopic cracks as discussed above. The coating 36 may be formed from a suitable material such as silicon oxide. Silicon oxide is advantageous because it is hard and impermeable and because it is impermeable to oxygen. For example, since the silicon oxide already includes oxygen, it cannot be oxidized by the oxygen in the air. The silicon oxide has substantially the same coefficient of thermal expansion as the silicon carbide in the matrix 14. Because of this, it has properties of moving with the matrix 14 with changes in temperature. The coating of silicon oxide may be deposited on the matrix under substantially the same conditions of various parameters such as temperature, pressure and flow rate as those used to deposit the matrix 14 of silicon carbide on the substrate.

The deposition of the silicon oxide on the matrix 14 may also be accomplished by liquid spray or immersion such as discussed above. Other materials such as silicon nitride may be provided as the layer 36. Furthermore, other materials such as metal oxides, metal nitrides, metal silicides, metal borides and metal carbides may also be used as the layer 36. The layer 36 may be viscous.

Figure 1:
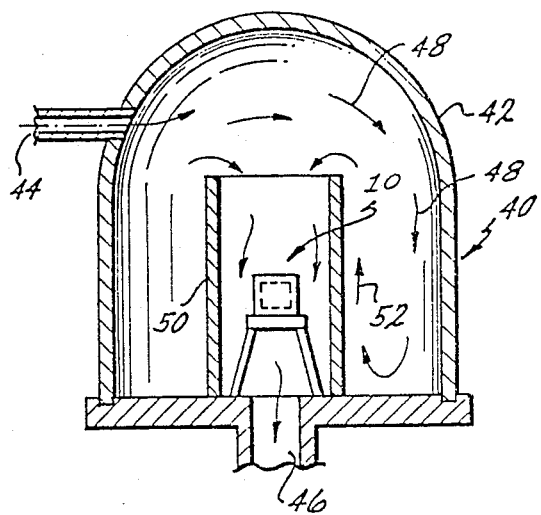
FIG. 1 is a schematic drawing of apparatus for producing materials included in a support base of a printed circuit board constituting this invention.

FIG. 1 illustrates a schematic diagram of a furnace, generally indicated at 40, which may be used to produce the composite materials described above. The furnace 40 includes as enclosure 42 having an inlet 44 and an outlet 46. Gases, such as those used to produce a chemical vapor deposition of the matrix 14 on the substrate 10, are introduced into the furnace 40 through the inlet 44. The gases flow downwardly along the walls defining the enclosures as indicated by arrows 48. The gases then flow upwardly along a partition 50, as indicated by arrows 52. Since the path defined by the arrows 48 and 52 within the furnace 40 is relatively long, the gases have a considerable opportunity to become heated to the temperature of the furnace 40. The gases then flow downwardly within the space defined by the partition 50 and flow from the furnace 40 through the outlet 46. During the flow of the gases within the partition 48, the gases have an opportunity to become deposited on the article, such as the substrate 10, in which a deposition is to be provided.

EXAMPLES

Example No. 1

Starting Substrate—Carbonized Rayon Felt $\frac{1}{4}"\times\frac{1}{2}"\times 4"$—Density=0.1 gm/cc Fiber Volume about 7%

The substrate was heated to approximately 1150°–1250° C. to thermally stabilize the substrate. The temperature of the substrate was then reduced to a value between approximately 700°–1000° C.

Then approximately 200 cc. hr of $H_2SiCl_2$ (dichlorosilane) and 5 LPM (liter/min) of $NH_3$ (ammonia) were flowed through the substrate for approximately 15 minutes to deposit approximately 1000A–5000A (angstrom) of $Si_3N_4$ (silicon nitride) coating on and about the surfaces of all of the fibers throughout the felt substrate (slides). This constitutes the intermediate layer 24.

The combination of the substrate 10 and the intermediate layer 24 was removed and inspected. The combination was then replaced in the furnace and heated to temperature between about 900° C. and 1200° C. and preferably about 1040° C. and infiltrated with methyltrichlorosilane using applicant's standard conditions for a total of 25 hours to form the matrix 14 and bring the density of the composite to about 1.50 gm/cc. The standard conditions are set forth in row 5 of the table constituting FIG. 8.

Then the composite material was vacuum impregnated with a 12% $B_2O_3$ (Boron oxide) doped TEOS (tetraethylorthosilicate). The composite was then hydrolized in a humidity chamber to form alcohol and a borosilicate residue on the surface of the exposed surfaces in the SiC (silicon carbide) matrix 14 and the fiber substrate 10 throughout the system.

A borosilicate residue is advantageous because boron depresses the temperature at which glass softens. This causes the softening temperature of the glass to be reduced to a sufficiently low value so that the layers in the composite cannot be oxidized because the energy in the layers is insufficient to accomplish this. The composite was then placed in a vacuum chamber and heated to a temperature of about 1200° C. to densify and flow the glaze. This provided a 1–5 micron coating on all exposed surfaces.

Example No. 2

Rayon, pitch, PAN (acrylic) based carbon fibers or silicon carbide, alumina mullite, quartz, zirconia silica or other ceramic fiber have been used as the substrate.

The volume fraction (V/0) of the substrate was between about 2.5–60%. The volume fraction of the substrate was normally about 35%. The volume fraction indicates the relative volume of the substrate material in the total volume of the substrate 10.

A binder was used to hold the fibers in position during the matrix infiltration. The binder can be any material that, when heated to a temperature of about 1200° C., provides a pyrolized residue to hold the fibers in their final shape, orientation and volume fraction. Phenolic resin has been most commonly used but many others are available. A primary key lies in providing a substrate with open pores and a minimum of pores with bottlenecks so that reactive gases for producing the subsequent layers are free to permeate the composite structure. The intermediate layer 24 and the matrix 14 for the second example were produced as in the first example.

Example No. 3

Alternate binders for Example No. 2 have been phenolic with approximately 5–20% of polyurethane, styrene or other suitable filler that will enhance the open nature of the pore structure. Alternate binders may also include colloidal silica and colloidal alumina. In addition, the use of fugitive fillers with reduced melting temperatures has provided open gas paths to reduce the time of processing the phenolic. A fugitive filler vaporizes at elevated temperatures and produces pores to enhance the open nature of the substrate. An example of a fugitive filler is nylon which melts or vaporizes at relatively low temperatures. When the nylon melts or vaporizes, it runs and produces tunnel-like pores in the substrate.

Example No. 4

An alternate binder to those specified in Example #2 has also been a polycarbosilane resin which has been processed similarly to the phenolic. It tends to heat shrink about the fibers of the substrate during pyrolysis, thus enhancing the open pore structure of the substrate and reducing bottleneck porosity of the substrate. Pyrolysis of the substrate in a vacuum or in an inert atmosphere has resulted in a silicon, carbon or nitrogen type of residue. However, pyrolysis of the substrate under atmospheric conditions has resulted in a low density $SiO_2$ residue which has a low strength but which is quite suitable as a binder for ceramic fibers that would otherwise react with the carbon of an organic binder. As will be apreciated, since the residue is silicon dioxide, it does not react with the binder.

Example No. 5

Figure 9:
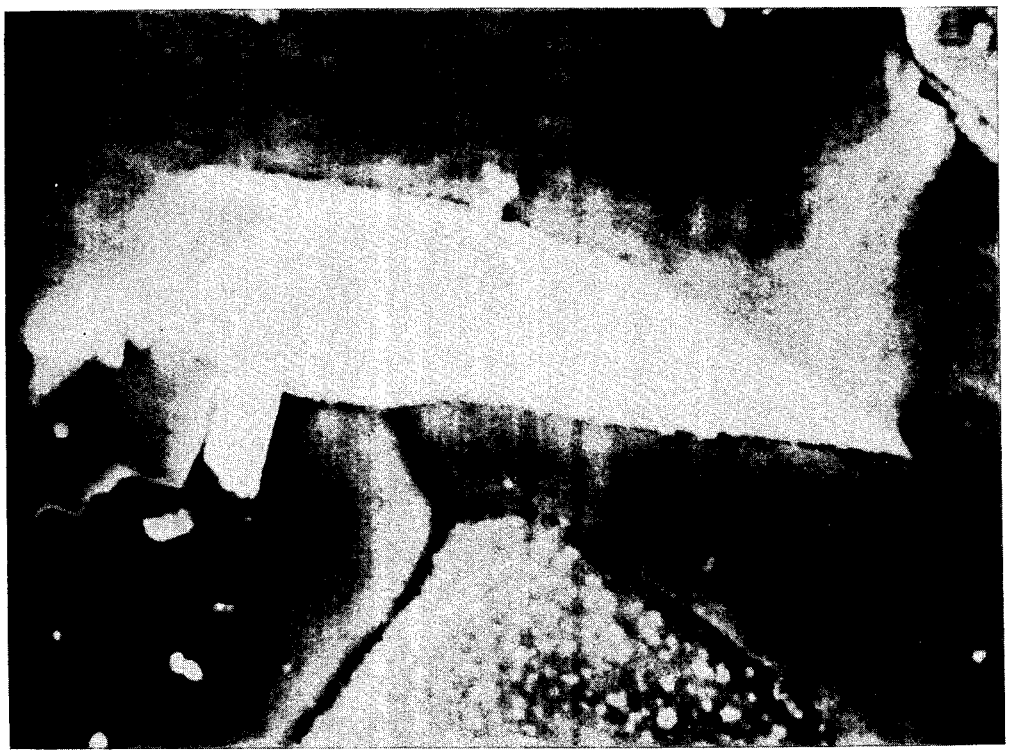

Silicon carbide (SiC) or carbon-infiltrated SiC or graphite grain or fiber have been used as the substrate. Graphite or other high temperature materials with an appropriate coefficient of thermal expansion have also been used as the substrate. The substrate was placed in a vacuum chamber and heated to a temperature between approximately 900° C. and 1200° C. The pressure in the vacuum chamber was about 5 mm(Torr) to 250 mm(Torr). A source gas constituting dimethyldichlorosilane was then passed through the chamber to provide the chemical vapor deposition of the matrix 14. The source gas was mixed with a carrier constituting hydrogen and with a diluent constituting argon. By varying the temperature, pressure and gas flow as shown in FIG. 1, the Vickers Hardness Number ($VH_n$) of the matrix 14 has been controlled. This hardness is a function of the free silicon or free carbon in the system. The stoichiometric SiC provided a Vickers hardness ($VH_n$) of about 2600-2800. $VH_n$ numbers above this range have increased amounts of free carbon at the grain boundaries. $VH_n$ numbers below this range have increased amounts of free silicon at the grain boundaries. This may be seen in FIG. 9. As will be seen in rows 1 and 2 of the table constituting FIG. 8, the Vickers hardness of the matrix 14 is reduced when the temperature and pressure of the flowing gases are reduced while rate of the gases, such as dimethyldichlorosilane and argon, is maintained constant. As will be seen in rows 2 and 3 of the table constituting FIG. 8, the Vickers hardness of the substrate is increased when the temperature and pressure of the gases are maintained substantially constant and the rate of flow of the dimethyldichlorosilane is maintained substantially constant but the rate of flow of the argon is increased.

Example No. 6

The same substrate as in Example #5 was used.
The parameters for producing the matrix 14 were as follows:
Pressure—5 mm—250 mm
Temperature—900°–1200° C.
Source Gas—Trimethylchlorosilane (TMCS), —Boron Trichloride ($BCl_3$)
Carrier—Hydrogen
Diluant—Argon To deposit the matrix 14, coating runs were made with trimethylchlorosilane (TMCS). This resulted in higher deposition rates than obtained with equivalent coatings deposited from dimethylchlorosilane (DMS) or methyltrichlorosilane (MTS). The microstructure, however, tended to become columnar. A columnar structure may not be desirable because it defines lines representing differences in properties. As a result, cracks tend to be produced along these lines.

A 10% addition of boron chloride ($BCl_3$) resulted in microstructure refinement by combining the excess carbon with boron to form $B_4C$ (Boron Carbide). This refinement in microstructure in turn resulted in increased coating stength, a glassy structure and controllable hardnesses of approximately 3000-4000$VH_n$.

The refinement in microstructure tended to enhance the homogeneity of the matrix 14 by producing particles of reduced size. This prevented the matrix 14 from being columnar. The inclusion of boron chloride to produce a glassy structure was desirable because the boron chloride enhanced the production of the fine grain structure and caused the matrix to be oxidation resistant.

Example No. 7

Typical $\frac{1}{4}''\times\frac{1}{2}''\times 4''$ carbon fiber substrates were prepared by using both a phenolic resin char binder and external fixturing to hold the fibers in position prior to SiC infiltration to form the matrix 14.

FIGS. 10a and 10b shows the interstices of a fiber bundle to be filled with a resin char and overcoated with a sheath of silicon carbide deposited by chemical vapor deposition (CVD). Those fibers free of char in the areas of the char-bonded fiber bundle are uniformly sheathed with CVD SiC. (FIG. 10)

Figure 11:
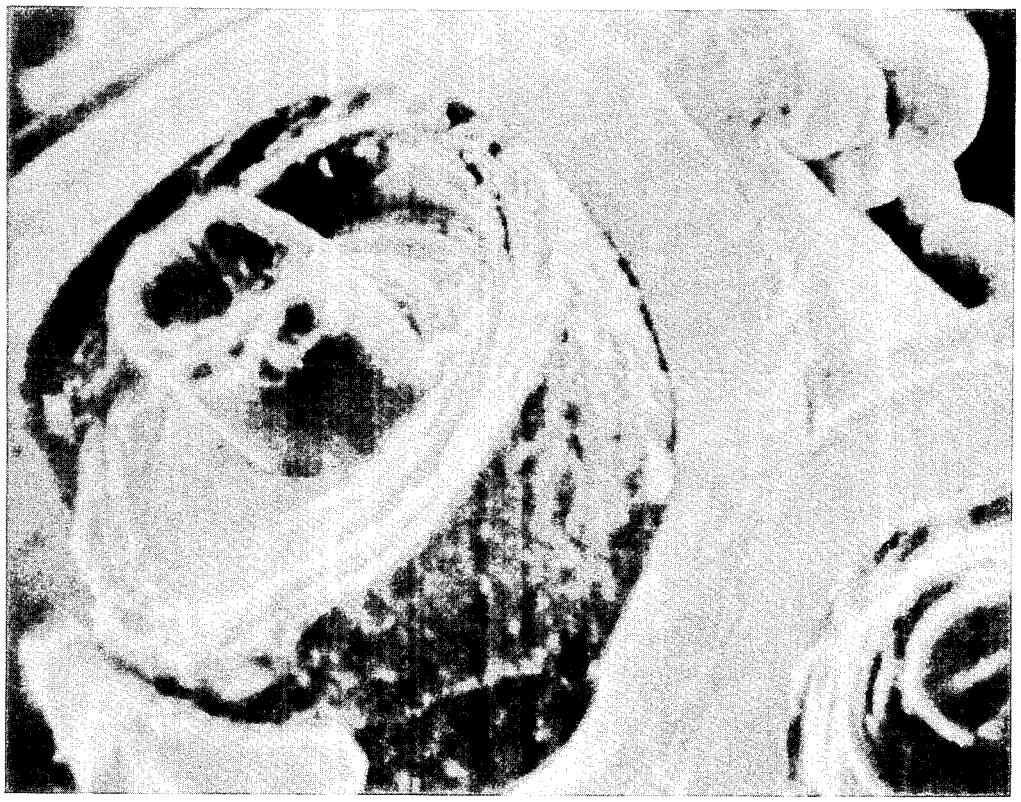
Figure 12:
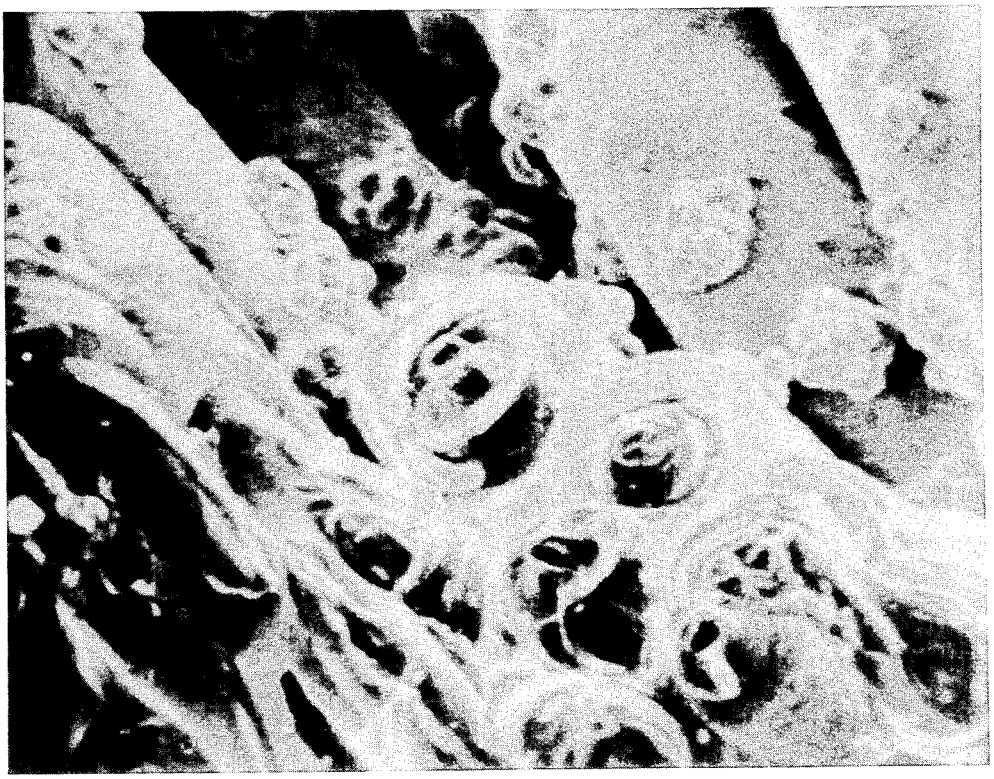

FIGS. 11 and 12 show the uniform concentric sheathing of the fibers, their bonding together by the CVD sheath, the lack of bond strength (fiber pull out) between the fiber substrate and the CVD matrix 14 and the open nature of the substrate interstices even after infiltration with the CVD matrix (FIGS. 11 and 12).

Example No 8

Figure 13:
Figure 14:

FIGS. 13 and 14 show the dramatic difference in the deposition thickness of the SiC matrix 14 vs fiber location in the substrate 10. Typical CVD infiltration efforts resulted in increased thicknesses of the matrix 14 deposited at, or close to, the surface of the substrate 10. Examined in cross-section, the thickness of the matrix coating in such typical CVD infiltration decreases dramatically as one visually approaches the center of the composite material. This increased thickness in the matrix coating at the periphery of the composite material tends to block the material of the matrix 14 from being deposited into the core of the substrate 10. As a result, the external surface of the matrix 14 often has to be shaved in order for the deposition of the matrix to be continued into the core of the substrate 10.

FIGS. 13 and 14, however, show an ability to control the phenomena discussed in the previous paragraph and, in fact, reverse it. FIGS. 13 and 14 are at the same magnification and show a typical two-fiber orientation. The relative orientations of the photographs of FIGS. 13 and 14 in the composite refractory material may be seen from the photograph of FIG. 15, which shows the composite material with a reduced magnification relative to the photographs of FIGS. 13 and 14. FIG. 15 also shows the relative positioning in FIG. 15 of the photographs constituting FIGS. 13 and 14.

Taken within 0.010" of the specimen surface, the photograph of FIG. 13 has approximately one-third ($\frac{1}{3}$) of the matrix thickness shown on the fibers in FIG. 14, which is a photograph taken approximately 0.125" from the specimen surface. In other words, the deposition internally in the composite material is thicker than at the surface of the composite material. This deposition was obtained by using methyltrichlorosilane (MTS). A complete reversal of this profile can be made by using DMS under standard infiltration conditions.

In view of the above, the thickness of the matrix at different positions in the composite material can be controlled by varying the properties of the chemical vapor deposition at different times. For example, the thickness of the matrix at different positions in the composite material can be controlled by introducing different chemical vapors (such as trimethylchlorosilane, dimethychlorosilane and methyltrichlorosilane) into the substrate 10 at different times.

Figure 16:
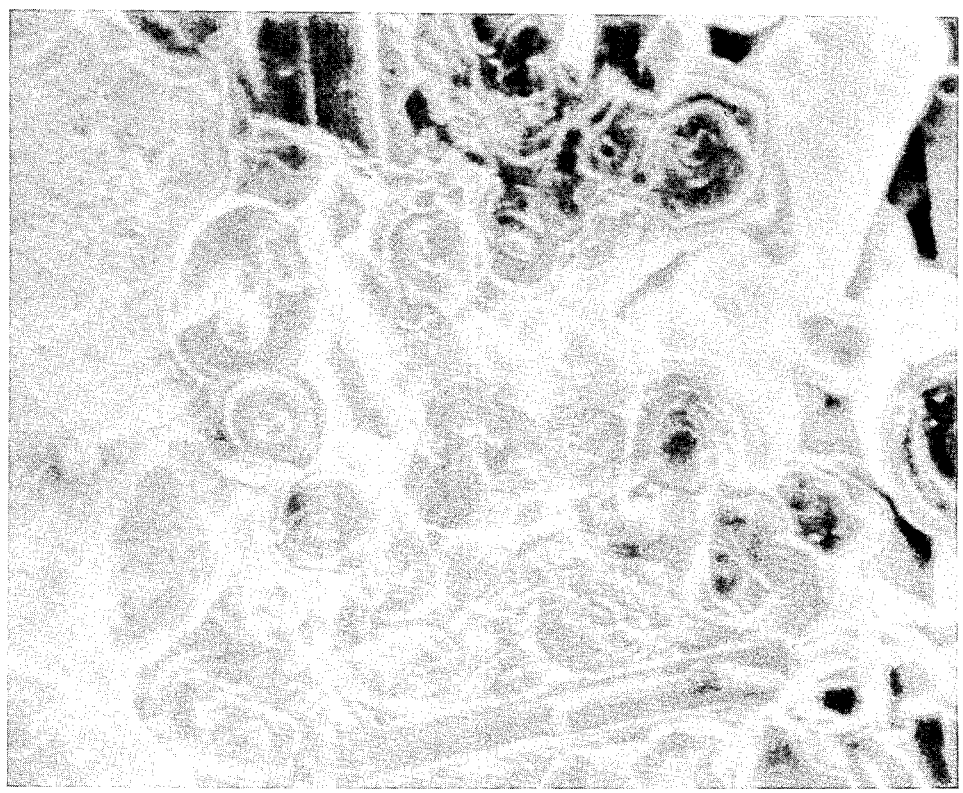

The ability to control infiltration thickness can also be used to grade a particular substrate from a CVD filtration bonded to a CVD SiC coated part. FIG. 16 show a cross-section of an infiltrated fibrous part integrally locked (bonded) to a homogeneous CVD SiC overcoating.

Example No. 9

Diluants such as argon and helium have been successfully used to control (such as by flattening) deposition profiles, suppress soot formation and control the microstructure of the matrix 14 and other layers such as the intermediate layer 26. Because of its specific heat, argon has been used to cool or maintain the reactive temperatures of the gases within controlled limits when the set-up geometry and mass/gas flow conditions have indicated the desirability of this. Since helium has a relatively high specific heat, helium has been used to increase the reactive temperatures of the gas, thus providing an ability to minimize set-up flow distances and still achieve maximum gas temperatures in the reactive zone.

Example No. 10

Silicon carbide (SiC) and graphite grains or particles and graphite and/or ceramic fibers have been combined to form the substrate 10. Such combinations have been successful. For example, typical flexural strengths of approximately 8-10,000 psi for a phenolic char-bonded silicon carbide grain substrate, infiltrated to 2.10 grams/cc to form the matrix 14, have been produced. This is approximately equal to the strength of commercially available silicon nitride bonded to SiC grain at densities of greater than 2.80 gm/cc.

Example No. 11

Substitution of silicon carbide grain (particles) and graphite particles—A combination of SiC and graphite particles, and particles with continuous and discontinuous graphite and/or ceramic fibers, has been successful in providing a satisfactory substrate. This substrate replaces substrates made entirely from fibers such as the substrates specified above in Examples 1 and 2. A typical flexural strength of a phenolic char-bonded SiC grain substrate, infiltrated to 2.10 gm/cc, is approximately 8-10,000 psi. This is approximately equal to the strength, at densities greater than 2.80 gm/cc, of commercially available SiC grain bonded with silicon nitride.

Example No. 12

Density—0.1 gm/cc
Fiber Volume—7%

The steps specified below have been used to produce a starting substrate with the characteristics specified above in this Example #11. As a first step, the carbonized rayon felt was heated to 1150°-1200° C. to stabilize the felt thermally. The temperature of the felt was then reduced to approximately 900°-1100° C. Atmosphere - Vacuum 5-25 mm Hg (Mercury). The vacuum valve was then closed. Approximately 600 cc/hr of $Si(CH_3)Cl_3$ (methyltrichlorosilane), 9 LPH $H_2$ (Hydrogen) and 20 LPH Ar (Argon) were allowed to flow until the chamber pressure increased to approximately 125-225 mm Hg (Mercury).

The vacuum valve was then opened and the pressure was reduced to approximately 5-25 mm Hg. On reaching the pressure of approximately 5-25 mm Hg, the cycle specified above was repeated for a sufficient number of cycles to achieve the desired final density.

Because the requirements for the construction of the starting substrate and for the density of the final component vary widely from application to application, the actual process time and chamber set-up may also be modified as a function of the component design and the operational need.

A radio frequency barrier 60 is preferably formed on the support base 18. The barrier 60 may be formed from a suitable material such as tungsten or copper although other electrically conductive materials may also be used. The barrier 60 may be thin and substantially uniform. For example, the thickness of the barrier 60 may be in the order of one thousandth of an inch (0.001"). The radio frequency barrier 60 may be formed on the support base 18 in a conventional manner such as by chemical vapor deposition. Alternatively, the radio frequency barrier 60 can be applied to the support base 18 as a slurry containing particles of the electrically conductive material and a vaporizable binder. The slurry and the support base 18 can then be baked at an elevated temperature to vaporize the binder and fuse the electrically conductive particles to the support base. The barrier 60 is effective in preventing radio frequency energy from affecting the operation of the printed circuitry on the printed circuit board 11.

A dielectric layer 62 is preferably disposed on the radio frequency barrier 60. The dielectric layer 62 may be made from a suitable electrically insulating material such as aluminum nitride (AN), silicon nitride ($Si_3N_4$), or silicon dioxide ($SiO_2$) although other electrically insulating materials may also be used. The dielectric layer 62 may be thin and substantially uniform. For example, the thickness of the layer 62 may be approximately one thousandths of an inch (0.001). The dielectric layer 62 is effective in isolating the printed circuits on the printed circuit board 11 from the radio frequency barrier 60 and the support base 18.

The dielectric layer 62 may be formed in a conventional manner such as by chemical vapor deposition or physical vapor deposition. Alternatively, the dielectric layer 62 can be applied to the barrier 60 as a slurry containing particles of the electrically insulating material and a vaporizable binder. The slurry, the RF barrier 60 and the support base 18 can be baked at an elevated temperature to vaporize the binder and fuse on the barrier 60 the electrically insulating particles to form the dielectric layer 62.

Printed circuitry 64 may be disposed on the dielectric layer 62. The printed circuitry 64 may be formed in any suitable pattern depending upon the electrical functions to be performed by such printed circuitry. The printed circuitry 64 may be formed in any suitable manner known in the prior art. For example, the printed circuitry may be formed by (a) initially depositing a thin layer of copper on the dielectric layer 62, (b) then depositing a resist layer on the copper in a pattern corresponding to the printed circuitry 64, (c) thereafter etching the exposed copper to retain only the copper covered by the resist layer and (d) thereafter removing the resist layer. The printed circuitry 64 may have a thickness in the order of a few thousandths of an inch.

The printed circuitry may be a metal other than copper. Molybdenum, tungsten and tantalum are excellent candidates with coefficients of thermal expansion which somewhat closely match that of silicon based intergrated circuits. Physical or chemical vapor deposition as opposed to electrochemical deposition are suitable circuit conductor application techniques. Physical vapor deposition may be utilized with masking techniques to directly deposit the circuit patterns without subtractive etching techniques. This potentially may yield additional manufacturing cost advantages.

As will be appreciated, the printed circuitry 64 does not occupy all of the space defined by the thickness of the printed circuitry. Stated differently, there are spaces between the different electrical paths defining the electrical circuitry 64 This space is filled by dielectric material 66 in a thickness corresponding to the thickness of the printed circuitry 64. The dielectric material 66 may constitute the same material as that specified above for the dielectric layer 62.

The dielectric material 66 may be disposed in the space between the electrical circuitry by one of the methods discussed above for the formation of the dielectric layer 62. For example, the printed circuitry may be covered with a removable sheet having a pattern correponding to that of the printed circuitry. The dielectric material 66 may then be disposed in the space between the printed circuitry and the sheet covering the printed circuitry may then be removed. In this way, the dielectric material 66 is disposed only in the space between the printed circuitry 64 and is not disposed in any way on the printed circuitry.

The integrated circuit chip 20 may be disposed on the composite layer formed by the printed circuitry 64 and the dielectric material 66. Preferably the chip 20 is attached to the composite layer as by a suitable adhesive. The adhesive is preferably inorganic although suitable organic adhesives such as epoxies and resins may also be used. When an inorganic adhesive is used, the adhesive may be ... Electrical connections may be made from terminals or pins 68 (shown on an enlarged fragmentary basis in FIG. 8) in the integrated circuit chip 20 to terminals 70 in the printed circuitry 64. In this way, the integrated circuit chip 20 and the printed circuitry 64 may be included in an electrical system or sub-system.

In an alternate embodiment, a dielectric layer 72 may be disposed on the composite layer formed by the printed circuitry 64 and the dielectric material 66. The dielectric layer may correspond in construction and properties to the dielectric layer 62. A composite layer formed by printed circuitry 74 and dielectric material 76 may be disposed on the dielectric layer 72. This composite layer may correspond to the composite layer formed by the printed circuitry 64 and the dielectric material 66. However, the electrical paths defined by the printed circuitry 74 may be different from the electrical path defined by the printed circuitry 64. It will be appreciated that additional dielectric layers and composite layers defined by printed circuitry and dielectric material may be alternated on the composite layer in a manner similar to that described above for the dielectric layers 62 and 72 and the composite layers such as that defined by the printed circuitry 64 and the dielectric material 66. The integrated circuit chip 20 may be disposed on the external one of the composite layers defined by printed circuitry and dielectric material.

Instead of providing printed circuitry on some of the layers, resistances with controlled values of impedance may be provided on these layers. These layers may be provided by mixing particles of an insulating material with particles of a dopant having electrically conductive properties. For instance, the room temperature electrical resistivity of molybdenum is $9.8 \times 10^{-5}$ ohm-cm. The room temperature electrical resistance of tantalum is $1.2 \times 10^{-5}$ ohm-cm. A codeposited mixture of the two metals will yield an intermediate value of resistivity. Even more profound resistivity changes can be obtained by deposition or ion implantation of nitrogen (nitrides), oxygen or other insulating elements into the metallic conductor structure.

It has been difficult in the prior art to formulate, on printed circuit boards, layers which include dopants. This has resulted from the fact that the dopants have had to be handled at high temperatures above the melting temperature of the organic material defining the support base for the printed circuit board. The dopants have had to be handled at these high temperatures in order to melt, into a unitary material, the dopant and the material mixed with the dopant. Since the melting temperature of this mixture has been above the melting temperature of the material defining the support base for the printed circuit board, dopants have not been mixed with other materials on the printed circuit boards now in use to produce layers with controlled resistance values.

In the printed circuit board 11 of this invention, the support base 18 is made essentially from inorganic materials. As a result, the support base 18 can be heated to high temperatures without losing any of its properties. This temperature is in excess of the temperature at which the dopant and the material mixed with the dopant are heated to form the layer with controlled values of resistance at strategic positions in the layer or throughout the layer.

As will be appreciated, when more than one layer of printed circuitry is used, connections have to be made at strategic positions between the different layers. In the prior art, holes have been formed in the dielectric layer separating the adjacent layers of printed circuitry and these holes have been plated to establish an electrical continuity between the printed circuitry in the adjacent layers. This has provided unnecessary complications in the formulation of the printed circuit board. Plated thru-holes are a major source of manufacturing cost and defects since the thermal expansion of the organic layers typically used as insulating layers in conventional printed circuit boards are higher than the electrodeposited metal (usually copper) that is typically used to provide the conductive bridge between conductive layers. Plated thru-holes also represent unuseable printed circuit board surface area. Thus, the density of discrete integrated circuit mounts on the board is compromised by these dead zones.

Figure 19:
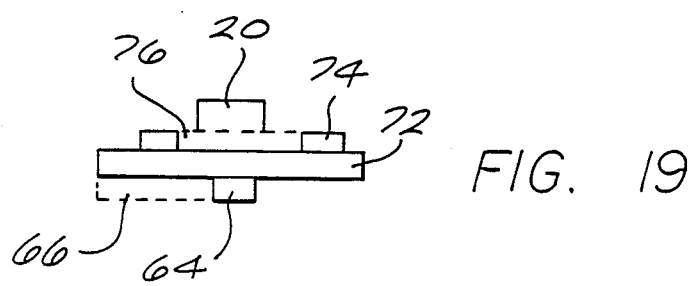
FIG. 19 is a sectional view of another printed circuit board which may be considered to be included within this invention.
Figure 20:
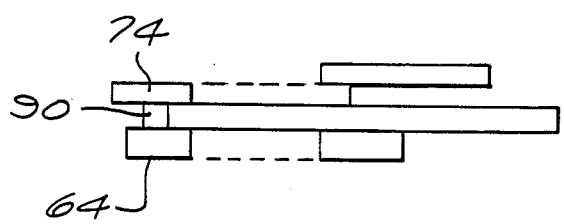
FIG. 20 is an enlarged fragmentary sectional view of two stacked printed circuit layers included in stacked and electrically related relationship in a printed circuit board and of a via electrically joining the two (2) printed circuit layers.

In contrast, in the printed circuit board 11 of this invention, vias 90 (FIG. 20) are formed to provide an electrical continuity between strategic positions in adjacent layers of printed circuitry. For example, the vias 90 may be provided between the printed circuitry 64 and the printed circuitry 74. In this specific example, the vias 90 constitute projections of electrically conductive material from the printed circuitry 64. These projections extend through the dielectric layer 72 and engage the printed circuitry 74. The vias may be formed in a conventional manner by techniques similar to those described above for the formation of the printed circuitry 64. The vias may connect the printed circuitry in the printed circuit board 11 to the integrated circuit chip 20. Dielectric material 76 (FIG. 19) may be disposed between the circuitry 74 in flush relationship with the printed circuitry.

Figure 18:
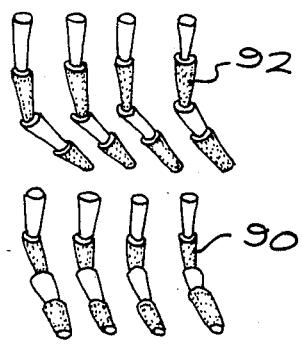
FIG. 18 is an enlarged fragmentary exploded perspective view of another embodiment of a support base which may be included within a printed circuit board of this invention.

It may be sometimes desired to provide the printed circuit board 11 with isotropic properties. In this way, the printed circuit board 11 will be able to expand equally in the two co-ordinate directions along the plane defined by the support base 18. In order to accomplish this, the substrate 10 may be formed with two (2) layers. One of the layers may be defined by fibers 90 (FIG. 18) disposed at an angle of approximately 45° to the x-direction. The other layer may be defined by fibers 92 and may be formed in the same manner as the first layer but may be considered to have been rotated through an angle of approximately 90° relative to the fibers 90 in the plane of the support base 18. As a result, the fibers 92 may be considered to be disposed at an angle of approximately 45° to the x-direction but perpendicular to the fibers 90.

The printed circuit board 11 of this invention has certain important advantages. It is inorganic or at least essentially inorganic. This is important in providing for a disposition on the board of integrated circuit chips which operate at high temperatures. Because of its inorganic properties, the printed circuit board 11 continues to maintain optimal properties even at the positions where the integrated circuit chip engages the board and creates hot spots on the board.

The printed circuit board 11 also has other important advantages over the prior art. It provides substantially the same coefficient of thermal expansion as the integrated circuit chip 20 disposed on the chip. This coefficient of thermal expansion can be varied for integrated circuit chips of different construction by adjusting the characteristics of the support base 18. Furthermore, the printed circuit board can be made isotropic.

Because of its inorganic composition, resistances of any pre-selected value can be formed on the printed circuit board 11 without producing any deterioration in the properties of the board. This tends to minimize the number of discrete components (such as resistances and inductance loops) which may have to be disposed on the printed circuit board, thereby reducing the size of the package formed by the board and any discrete elements attached to the board. It also tends to minimize the cost of producing such a package.

As will be appreciated, the discussion above has proceeded on the basis that the substrate 10 is included as a part of the support base 18. In some situations, however, the substrate 10 does not have to be included as a part of the support base 18. The support base 18 will then be formed as specified above without the inclusion of the substrate 10.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

We claim:

1. In combination,
a support base made from fibers covered by electrically insulating inorganic materials and having a particular coefficient of thermal expansion,
a layer of an electrically conductive material disposed on the support base,
a layer of an insulating ceramic dielectric layer disposed on the layer of conductive material,
an electrically conductive material disposed on the ceramic dielectric layer in a pattern to define a printed circuit,
dielectric material filling the areas between the electrically conductive material defining the printed circuit, and
an integral circuit chip disposed on the layer formed by the printed circuitry and the dielectric material, the integrated chip having electrical terminals connected to the printed circuit, the support base having substantially the same coefficient of thermal expansion as the integrated circuit chip.

2. In a combination as set forth in claim 1, the fibers being disposed to provide a controlled expansion in first and second co-ordinate directions with changes in temperature, the electrically insulating inorganic materials covering the fibers to define a matrix and to adjust the coefficient of thermal expansion of the fibers so that the coefficient of thermal expansion of the support base substantially matches that of the integrated circuit chip.

3. In combination as set forth in claim 2,
the fibers being made from an inorganic material.

4. In a combination as set forth in claim 2,
the fibers being made from an organic material.

5. In a combination as set forth in claim 2,
vias made from an electrically conductive material and extending from the printed circuit and communicating electrically with the electrical leads in the integrated circuit chip.

6. In a combination as set forth in claim 1,
the support base being planar,
the fibers being defined by warp-and-woof relationships to provide, with changes in temperature of the substrate and the integrated circuit chip, a thermally isotropic relationship of the support base in first and second coordinate directions defining the plane of the support base.

7. In combination, in a printed circuit board,
a support base formed from electrically insulating inorganic materials and having a particular coefficient of thermal expansion, the electrically insulating inorganic materials including inorganically coated discrete elements and an inorganic matrix covering the inorganically coated discrete elements,
second means disposed on the first means and made from an electrically insulating inorganic material and defining an electrical dielectric,
third means disposed on the second means and made from an inorganic material and defining a printed circuit, and
an integrated circuit chip disposed on the third means and attached to the third means and having substantially the particular coefficient of thermal expansion.

8. In a combination as set forth in claim 7,
the support base being planar and having substantially the particular coefficient of thermal expansion in each of two co-ordinate directions defining the plane of the support base.

9. In a combination as set forth in claim 8,
the printed circuit means defining electrical circuits and occuping only portions of a plane in accordance with the pattern of such circuits, and
electrically insulating means disposed in the plane of the printed circuit means to occupy the space between the printed circuit means and disposed in flush relationship with the printed circuit means, the electrically insulating dielectric means being inorganic,
the integrated circuit chip being electrically coupled to the printed circuit means to define electrical circuitry with the printed circuit means.

10. In a combination as set forth in claim 8,
the support base including a pair of layers disposed in a planar relationship and the discrete elements extending in a warp-and-woof relationship, the discrete elements in one layer being disposed in a skewed relationship to the discrete elements in the other layer.

11. In combination for use with an integrated circuit chip having a particular coefficient of thermal expansion, a support base including discrete elements coated with an electrically insulating inorganic material and including a matrix on the inorganically coated discrete elements, the support base being disposed in a planar relationship and having substantially the particular coefficient of thermal expansion, a first layer disposed on the base plate and made from an inorganic material providing a radio frequency barrier, a second layer disposed on the first layer and made from an electrically insulating inorganic material providing an electrical dielectric, and a third layer disposed on the second layer and made from an inorganic material defining an electrical circuit for connection to the integrated circuit chip.

12. In a combination as set forth in claim 11, the first layer covering one surface of the support base and the second layer covering the first layer and the third layer only partially covering the second layer in a pattern defining the electrical circuit.

13. In combination as set forth in claim 11, an electrically insulating dielectric layer disposed on the second layer in the spaces not occupied by the third layer, the electrically insulating dielectric layer being made from an inorganic material and being disposed in flush relationship with the third layer.

14. In a combination as set forth in claim 13, the support base being constructed to be substantially thermally isotropic in all directions in the plane defined by the support base.

15. In combination for use with an integrated circuit chip, a support base made from an electrically insulating inorganic material defined by electrically insulating inorganically coated discrete elements and an inorganic matrix covering the discrete elements, and printed circuitry disposed on the support base in electrically isolated relationship to the support base.

16. In a combination as set forth in claim 15, the support base being provided with a coefficient of thermal expansion substantially corresponding to that of the integrated circuit chip, the support base being constructed to support the integrated circuit chip for connection electrically to the printed circuitry.

17. In a combination as set forth in claim 16, the support base being thermally isotropic.

18. In a combination as set forth in claim 16, a resistive element disposed on the support base and formed in a layer from a mixture of an electrically conductive dopant and a material mixed with the dopant to provide the mixture with the preselected resistance value.

19. In combination, a printed circuit board including:

a support base made from an electrically insulating inorganic material defined by thermally insulating inorganically coated discrete elements covered by an inorganic matrix, printed circuitry disposed on the support base in electrically insulated relationship to the support base, and an integrated circuit chip disposed on the support base in fixed relationship to the support base and connected electrically to the printed circuitry.

20. In a combination as set forth in 19, the support base being provided with a coefficient of thermal expansion substantially equal to the coefficient of thermal expansion of the integrated circuit chip.

21. In a combination as set forth in claim 20, the support base being thermally isotropic.

22. In a combination as set forth in claim 21, a layer of an electrically resistive material disposed on the support base, said layer being formed from a mixture of an electrically conductive dopant and another material in a ratio to provide the resistance of the electrically resistive material with a preselected value.

23. A support base for a printed circuit board, including:

a substrate formed from a plurality of inorganically coated discrete elements and an inorganic matrix of the discrete elements, and a matrix covering the discrete elements and made from an electrically insulating inorganic material and having relatively little, if any, chemical and mechanical bonding to the substrate, the combination of the substrate and the matrix being substantially flat.

24. A support base as set forth in claim 23 wherein the combination of the substrate and the matrix being thermally isotropic.

25. A support base as set forth in claim 24 wherein the combination of the substrate and the matrix is constructed to support an integrated circuit chip and wherein the combination of the substrate and the matrix is constructed to provide a coefficient of thermal expansion substantially equal to that of the integrated circuit chip.

26. A support base for a printed circuit board, including:

a substrate formed from a plurality of fibers, and a matrix formed from an electrically insulating inorganic material and covering the fibers and providing little, if any, chemical and mechanical binding to the fibers to obtain a relative movement between the substrate and the matrix with changes in temperature and upon the imposition of mechanical forces against the support base, the combination of the substrate and the matrix being planar.

27. A support base as set forth in claim 26, including:

the fibers being disposed in a warp-and-woof relationship and the electrically insulating inorganic material constituting the matrix being disposed in encasing relationship to the fibers.

28. A support base as set forth in claim 27, including, the electrically insulating inorganic material constituting the matrix being disposed at the interstices of the warp-and-woof relationship.

29. A support base as set forth in claim 27 wherein the fibers in the warp-and-woof relationship are in a first planar layer and wherein a second layer is formed from fibers in a warp-and-woof layer corresponding to the warp-and-woof relationship of the fibers in the first layer, the fibers in the second layer being disposed in substantially 90° relationship to the fibers in the first layer, and a matrix is formed from the electrically insulating inorganic material and covers the fibers in the second layer in substantially the same relationship as that between the fibers in the first layer and the matrix.

30. A support base as set forth in claim 28 wherein, the fibers in the warp-and-woof relationship are in a first planar layer, and wherein
a second layer is formed from fibers in a warp-and-woof relationship corresponding to the warp-and-woof relationship of the fibers in the first layer, the fibers in the second layer being disposed in a substantially perpendicular relationship to the fibers in the first layer, and wherein
a matrix is formed from the electrically insulating inorganic material and covers the fibers in the second layer in substantially the same relationship as that between the fibers in the first layer and the matrix.

* * * * *